(12) United States Patent
Mizuno et al.

(10) Patent No.: US 7,990,111 B2
(45) Date of Patent: Aug. 2, 2011

(54) METHOD AND APPARATUS FOR DETECTING INTERNAL ELECTRIC STATE OF IN-VEHICLE SECONDARY BATTERY

(75) Inventors: Satoru Mizuno, Okazaki (JP); Hiroaki Ono, Tokoname (JP); Masayuki Tomura, Oobu (JP)

(73) Assignees: Nippon Soken, Inc., Nishio (JP); Denso Corporation, Kariya (JP)

( * ) Notice: Subject to any disclaimer, the term of this patent is extended or adjusted under 35 U.S.C. 154(b) by 426 days.

(21) Appl. No.: 12/275,653

(22) Filed: Nov. 21, 2008

(65) Prior Publication Data

US 2009/0134843 A1 May 28, 2009

(30) Foreign Application Priority Data

Nov. 21, 2007 (JP) ................................. 2007-301648
Nov. 21, 2007 (JP) ................................. 2007-301708

(51) Int. Cl.
*H02J 7/04* (2006.01)
*H02J 7/00* (2006.01)
*H02J 7/16* (2006.01)

(52) U.S. Cl. ........ 320/139; 320/132; 320/137; 320/152; 320/157

(58) Field of Classification Search .................. 320/149
See application file for complete search history.

(56) References Cited

U.S. PATENT DOCUMENTS

| 6,683,440 | B2 | 1/2004 | Kawakami et al. | |
| 7,554,296 | B2 * | 6/2009 | Mizuno et al. | 320/132 |
| 2004/0207367 | A1 * | 10/2004 | Taniguchi et al. | 320/149 |
| 2007/0090805 | A1 | 4/2007 | Mizuno et al. | |

FOREIGN PATENT DOCUMENTS

| JP | 10-098837 | 4/1998 |
| JP | 10-154533 | 6/1998 |
| JP | 2000-323182 | 11/2000 |
| JP | 3249788 | 11/2001 |
| JP | 2003-059544 | 2/2003 |
| JP | 2004-101188 | 4/2004 |
| JP | 2007-121030 | 5/2007 |
| JP | 2007-271424 | 10/2007 |

OTHER PUBLICATIONS

Japanese Office Action dated Nov. 2, 2009, issued in corresponding Japanese Application No. 2007-301648, with English translation.
Japanese Office Action dated Nov. 2, 2009, issued in corresponding Japanese Application No. 2007-301708, with English translation.

* cited by examiner

*Primary Examiner* — Edward Tso
*Assistant Examiner* — Ahmed Omar
(74) *Attorney, Agent, or Firm* — Nixon & Vanderhye PC

(57) ABSTRACT

In a proposed apparatus and method, constant-voltage charge is performed with an in-vehicle secondary battery immediately after start of a vehicle or during running of the vehicle. A quantity relevant to polarization caused in the battery immediately after start of the constant-voltage charge is calculated using data of the charge current. It is determined whether or not a change rate of the calculated polarization-relevant quantity is less than a given threshold. When the change rate is less than the given threshold, a plurality of data of the charge current sampled and held during a predetermined period of time are acquired. A value of the charge current to be accumulated until the charge current reaches a given final value is calculated using the plurality of data of the charge current. The internal electric state of the battery is estimated based on the accumulated value of the charge current.

8 Claims, 8 Drawing Sheets

METHOD AND APPARATUS FOR DETECTING INTERNAL ELECTRIC STATE OF IN-VEHICLE SECONDARY BATTERY

CROSS REFERENCES TO RELATED APPLICATION

The present application relates to and incorporates by reference Japanese Patent Applications No. 2007-301648 filed on Nov. 21, 2007 and No. 2007-301708 filed on Nov. 21, 2007.

BACKGROUND OF THE INVENTION

1. Technical Field

The present invention relates to a method and apparatus for is detecting the internal electric state of an in-vehicle secondary battery.

2. Related Art

In recent years, a second battery (rechargeable battery) mounted in a vehicle has been increased in its capacity so as to meet an increase in the amount of electrical loads mounted in the vehicle. Hence, avoiding the overcharge and overdischarge of the in-vehicle secondary battery has become very significant in these years. It is thus necessary to detect reliably and accurately information indicating the internal electric state of the second battery, which information includes information about a residual charged capacity of the secondary battery.

In such a circumstance, Japanese Patent No. 3249788 discloses a conventional technique to estimate information indicating the internal electric state of an in-vehicle secondary battery. The estimation technique proposed by this publication uses a discharge current change so characteristic related to waveforms of changes in the discharge current immediately before the constant-voltage charge of the battery. Hereinafter, this change characteristic is referred to as a "charge current approximation function." This charge current approximation function is used to estimate a timing (estimated timing) at which the charge current reaches a given final value, and a capacity to be charged (charged capacity) until gaining the final charge current and a time necessary for the charge are calculated.

However, in the case of the forgoing technique, the charge current approximation function to be estimated is affected (i.e., fluctuated) by irregularities in the polarized state of the battery, resulting in that the function is deviated from the actual charge current waveform. Hence, in most cases, there is a large difference between a timing at which the actual charge current reaches the given value (i.e., actual timing) and the estimated timing. This results in that the accuracy of the charge capacity and the time necessary for the charge, calculated based on the foregoing estimating timing, becomes low.

In addition, in the case of the technique proposed by the foregoing publication, the charge current characteristic is estimated without considering influence resulting from differences of the charge efficiency of a battery. Hence, in particular, in an end period of the charge action, the charge current approximation function is obliged to have a lower accuracy. The estimation accuracy of the charged capacity and the time necessary for the charge is reduced.

SUMMARY OF THE INVENTION

The present invention has been made in consideration of the foregoing conventional technique, and an object of the present invention is to provide an apparatus for detecting the internal electric state of an in-vehicle secondary battery, which apparatus is able to accurately estimate the a timing at which the charge current during so constant-voltage charge reaches a given final value.

In order to achieve the above object, as one aspect, the present invention provides an apparatus that estimates an internal electric state of an in-vehicle secondary battery of which terminal voltage is regulated at a target value by operating an in-vehicle alternator, the apparatus comprising: a current detector that detects charge current flowing to the battery and discharge current from the battery; sampling means that samples and holds, at intervals, the current detected by the current detector; charge means that performs constant-voltage charge with the battery at a preset value given to the battery immediately after start of the vehicle or during run of the vehicle; first calculation means that calculates a polarization-relevant quantity relevant to an amount of polarization caused in the battery immediately after start of the constant-voltage charge using data of the charge current from the sampling and holding means; determination means that determines whether or not a change rate of the calculated polarization-relevant quantity is less than a given threshold; acquisition means that acquires from the sampling and holding means a plurality of data of the charge current sampled and held during a predetermined period of time when it is determined that the change rate of the calculated polarization-relevant quantity is less than the given threshold; second calculation means that calculates a value of the charge current to be accumulated until the charge current reaches a given final value, using the plurality of data of the charge current; and estimation means that estimates the internal electric state of the battery based on the calculated accumulated value of the charge current.

The present invention provides, as another aspect, a method that estimates an internal electric state of an in-vehicle secondary battery of which terminal voltage is regulated at a target value by operating an in-vehicle alternator, the method comprising steps identical to the components of the above apparatus.

In the present invention, a state where a change in the polarization-relevant quantity becomes slower after starting the constant-voltage charge is monitored. Then, using the past changes in the charge current, changes in the charge current after the present time are estimated. The estimated results are used to detect or determine the internal electric state of an in-vehicle secondary battery. Hence, for estimating the battery internal electric state, it is possible to reliably remove the influence of irregularities in the polarization caused in the battery when being charged, increasing the accuracy of the detection. The internal electric state of the battery is for example an SOC (state of charge), an SOH (state of health), and quantities relating the SOC and SOH (such as quantities obtained by subtracting the SOC or SOH from the fully charged capacity of the battery).

It is preferred that the constant-voltage charge is carried out immediately after the engine start. When the engine is in stop operation, it is normal that any charge and discharge to and from the battery is slight, whereby the polarization in the battery can be regarded as being almost zero. Hence, it is possible to increase the accuracy if calculation of the polarization-relevant quantity, improving the accuracy of detection of the battery internal electric state.

As another aspect, the present invention provides an apparatus that estimates an internal electric state of an in-vehicle secondary battery of which the terminal voltage is regulated at a target value by operating an in-vehicle alternator, the apparatus comprising: a current detector that detects charge current flowing to the battery and discharge current from the battery; sampling means that samples and holds, at intervals, the current detected by the current detector; charge means that performs constant-voltage charge with the battery at a preset value given to the battery immediately after start of the vehicle or during run of the vehicle; calculation means that calculates a charge current function indicating a temporal change in the charge current based on a plurality of data of the charge current sampled and held after start of the constant-voltage charge; storing means that stores previously a correcting value or a correcting function which has a correlation to deterioration of the battery; correction means that corrects the charge current function by the correcting value or the correcting function; accumulation means that accumulates the charge current until the charge current reaches a given final value, based on the corrected charge current function; and estimation means that estimates the internal electric state of the battery using the accumulated value of the charge current.

Hence, compared to the case of non-correction to the charge current function, it is possible to increase the accuracy of calculation of the charge-current accumulated value. It is not necessary to continue a long-term constant-voltage charge until the end of the charge period, so that the usability of the battery is improved and deterioration in the battery which is due to the long-term constant-voltage charge performed frequently is avoided.

BRIEF DESCRIPTION OF THE DRAWINGS

In the accompanying drawings.

DETAILED DESCRIPTION OF PREFERRED EMBODIMENTS

Referring to the accompanying drawings, embodiments of the present invention, which is according to the apparatus for detecting the internal electric state of an in-vehicle secondary battery, will now be descried.

First Embodiment

Referring to FIGS. 1-5, a first embodiment of the present invention will now be described. In the present embodiment, the detecting apparatus according the present invention is put into practice as an SOC (State Of Charge) calculating apparatus for an in-vehicle secondary battery.

Figure 1:
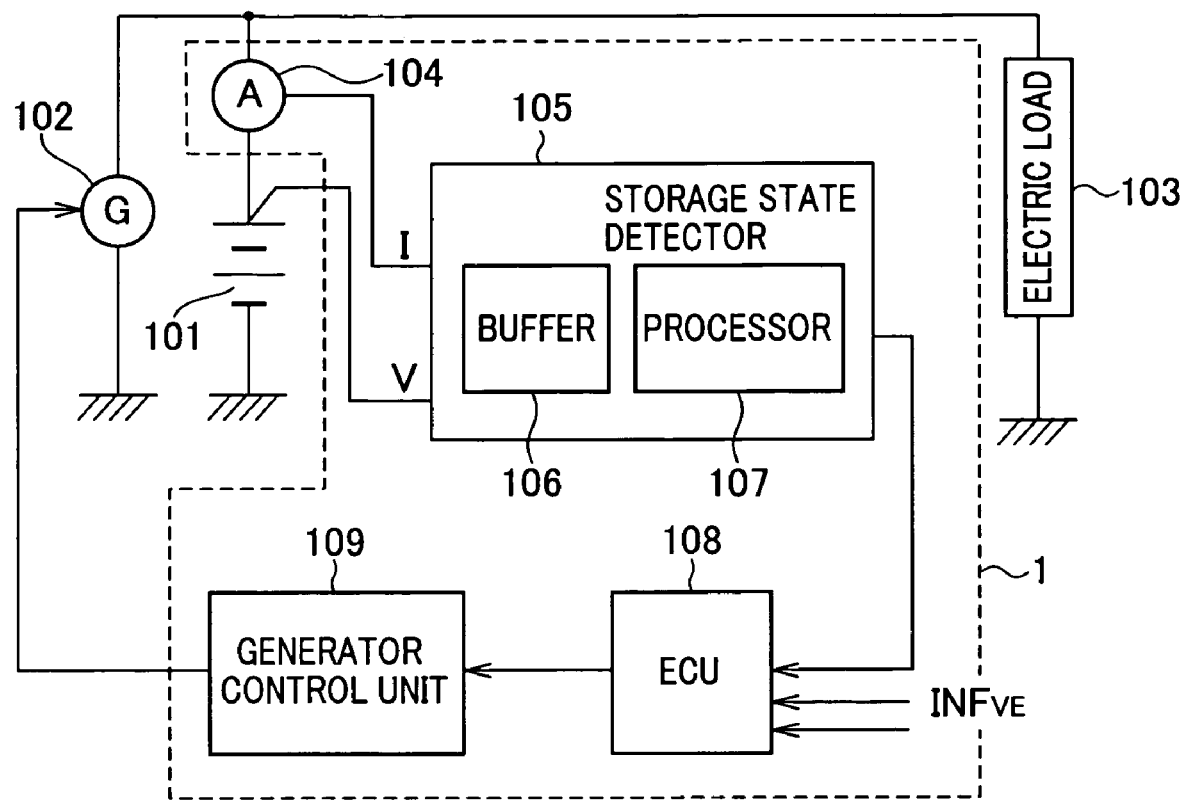
FIG. 1 is a block diagram showing an SOC calculating apparatus serving as an apparatus for the internal electric state of an in-vehicle battery, which is according to a first embodiment of the present invention.

FIG. 1 shows a block form of the SOC calculating apparatus t.

The SOC calculating apparatus 1 is mounted in a vehicle so that the apparatus 1 is electrically connected to an in-vehicle storage device (herein referred to as a battery (rechargeable or secondary battery), an in-vehicle generator 102 (in-vehicle AC generator, that is, alternator) driven by a vehicle engine (not shown), and an electric load 103 mounted in the vehicle. The generator 102 is produced as a field coil type of generator. The electric load 103 is powered by the battery 101.

The battery 101 is a secondary battery composed as a lead-acid battery, a nickel-hydrogen battery, or a lithium battery. Any type of the secondary battery can be applied to the present embodiment, but in the present embodiment, the lead-acid battery for vehicles is employed.

The SOC calculating apparatus 1 is provided with a current sensor 104 to detect the charge/discharge current to/from the battery 101 and a storage state detector 105. Of these, the current sensor 104 outputs the detected current as a digital signal. The storage state detector 105, which is an electric device, is configured to calculate information indicating the internal electric state of the battery 101, such as an SOC.

The storage state detector 105 is provided with a buffer 106 through which voltage and current signals are inputted therein and a processor 107, which serves as an essential calculation part in this SOC calculating apparatus 1, performs various kinds of calculation in consideration of polarization caused inside the battery 101.

The SOC calculating apparatus 1 is also electrically connected to an ECU (electronic control unit) 108, and this ECU 108 has an electric connection with a generator control unit 109. The ECU 108 is in charge of calculating the amount of generation which should be performed by so the generator 102, on the basis of the SOC given from the processor 107 and various pieces of information INFve including an engine state, a vehicle speed, and a generator revolution number.

The generator control unit 109 is assigned to controlling the output of the generator 102. That is, the generator control unit 109 controls, in a feedback manner, a field current given to the generator 102 so that the difference between the voltage of the battery 101 and a given regulation voltage converges to zero. As a result, the voltage of the battery 101 is controlled to this given regulation voltage. In addition, the generator control unit 109 gives the generator 102 with a control signal depending on the amount of the generation which is calculated by the ECU 108, so that this control signal makes the generator generate in response to a target amount indicated by the control signal.

In practice, in the storage state detector 105, the buffer 106 and the processor 107 are functionally realized by software calculated by a microcomputer incorporated in the storage state detector 105. Of course, an alternative configuration of the storage state detector 105 is to employ a dedicated calculation hardware circuit provided with logic circuits and others.

The buffer 106 is configured to sample and hold, at intervals, pairs of data composed of the voltage V of the battery 101 and the current I detected by the current sensor 104. As detailed later, the processor 107 calculates the SOC of the battery 101 by using, as input parameters, the pairs of data (voltage V and current I) given from the buffer 106.

<Constant-Voltage Charge Control>

Figure 2:
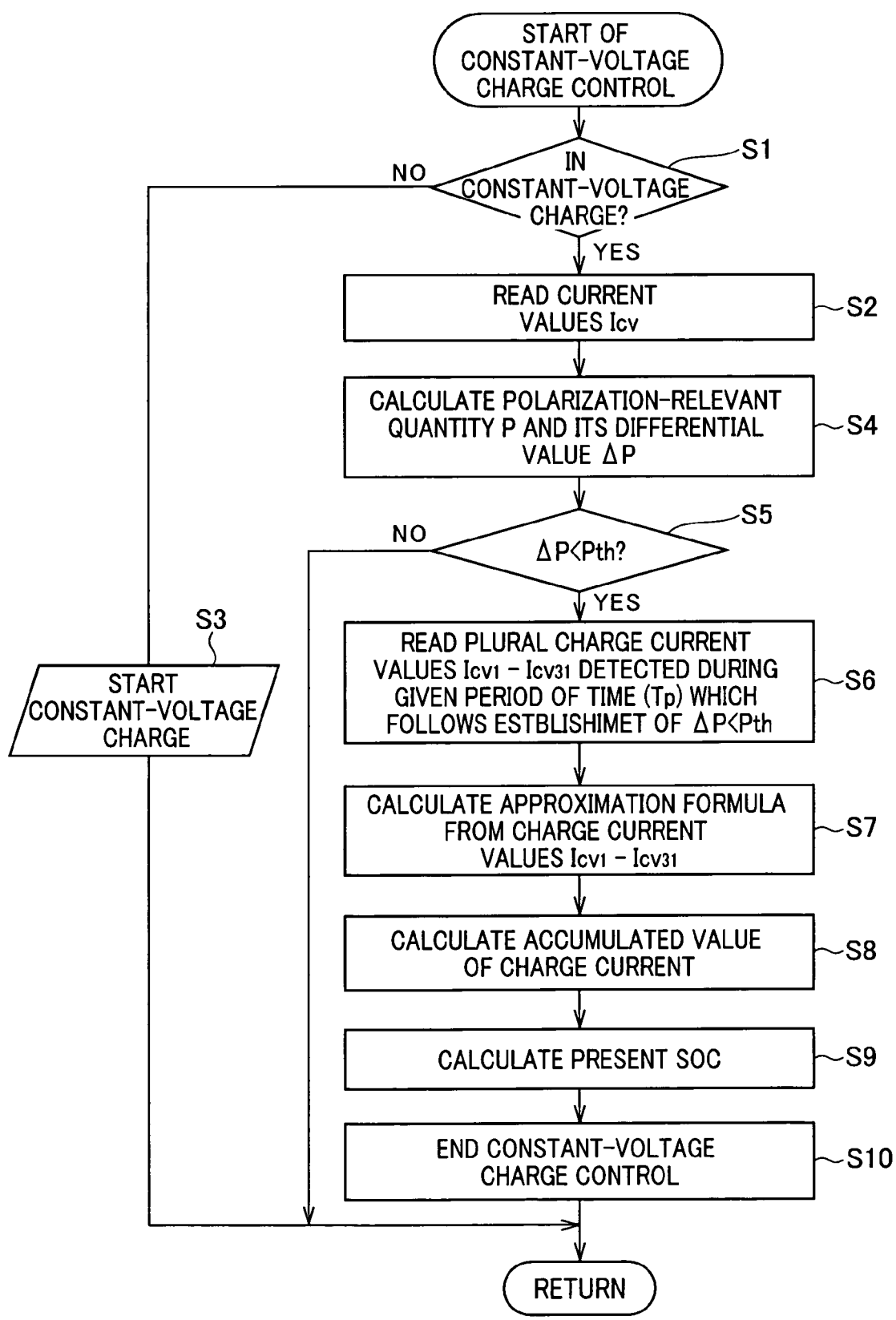
FIG. 2 is a flowchart outlining constant-voltage charge control executed by a processor incorporated in the SOC calculating apparatus.

Referring to FIG. 2, the operations for constant-voltage charge control, which is characteristic of the present embodiment, will now be detailed.

FIG. 2 shows a subroutine showing the constant-voltage charge control, which is executed repeatedly by the storage state detector 105, practically, the processor 107, at predetermined short intervals. This subroutine is under control of a not-shown main or management program also executed by the storage state detector 105. This subroutine is activated in response to the start of the engine or at a desired or preset timing during the run of the vehicle.

When the subroutine process for the constant-voltage charge control is started, the processor 107 determines whether or not the constant-voltage charge control is in operation currently using for example a flag check (step S1). If this determination is YES (in operation), the process proceeds to step S2, while if the determination is NO (not in operation), the process proceeds to step S3 where the constant-voltage charge control is started to apply a constant amplitude voltage to the battery 101. Incidentally, this constant-voltage charge control is performed such that the generation at the generator 102 (alternator) is controlled so as to maintain the voltage of the battery 101 at a constant voltage.

By the way, the execution at step S1 includes a check as to whether or not there has been a sudden load connection or disconnection, or a sudden change in the generated voltage at the generator 102 due to a sudden change in the engine revolution speed (the speed of revolution of the engine). When it is determined at step S1 that there has been such a sudden change, it is assumed that the constant-voltage charge control is not in operation now, even if this control has been in operation so fan. In this case, the process is made to proceed to step S4. This assumption processing takes it into account that delay will be caused due to the time constant in controlling the field current of the generator 102. Incidentally, when such a sudden change occurs in the generation and the load condition, it is preferred to halt the constant-voltage charge control shown in FIG. 2, and restart it after a given period of time has passed.

At step S2, the processor 107 reads the charge current Icv to the battery 101. At step S4, the processor 107 calculates a polarization-relevant quantity P (serving as a physical quantity indicating the polarized state: the polarization state quantity) and its differential value $\Delta P$ using the read-in charge current Icv. In the present embodiment, the polarization-relevant quantity P is calculated by the following formula (1):

$$Pn = Pn-1 + In*dt - 1/\tau*Pn-1*dt \tag{1}$$

wherein $\tau$ denotes a time constant, n denotes the present polarization-relevant quantity, and n-1 denotes the last polarization-relevant quantity calculated in the last calculation of FIG. 2 repeated at given intervals dt. Accordingly, Pn shows the present value of the polarization-relevant quantity P, Pn-1 shows the last value of the polarization-relevant quantity P, and In shows the present value of the charge current Icv. That is, a time difference between the present value and the last value is dt.

Incidentally, in the initial calculation of this formula (1), it is preferred that the last value Pn-1 is set to zero. In the present embodiment, for the sake of simplifying the calculation, the calculation cycle of the subroutine shown in FIG. 2 and thus a current sampling cycle at step S2 are set to be equal to the interval dt. In detail, T is a time constant of charge diffusion in the battery electrolyte, and is given a given value obtained through experiments in advance. From the formula (1), the present value Pn of the polarization-relevant quantity P (the polarization state quantity) is given by adding/subtracting, to/from the last value Pn-1 at the last sampling, an increased amount In·dt generated during the interval dt between the last and present sampling operations and a decreased amount Pn-1·dt/T decayed during the interval dt between the last and present sampling operations.

Meanwhile the differential value $\Delta P$ of the polarization-relevant quantity P is expressed by the following formula (2):

$$\Delta P = (Pn - Pn-1)/dt = In - 1/\tau * Pn-1 \tag{2}$$

The process then proceeds to step S5, where the processor 107 determines whether or not the differential value $\Delta P$ has decreased less than a given threshold Pth. If this determination is NO (that is, the decrease is more than Pth), the process is returned to the main routine. On the other hand, when the determination is YES (that is, the decrease less than Pth), the processor 107 recognizes that the polarization in the battery 101 has been stabilized at a specific amount of charge polarization. In this case, the process is allowed to proceed to step S6, where the processor 107 reads charge current amounts Icv1 to Icv31 sampled and stored during a predetermined period of time T (e.g., 30 seconds) starting from at a time instant when the differential value $\Delta P$ decreased less than the threshold Pth.

Then, the processor 107 proceeds to step S7, where the read-in charge current amounts Icv1 to Icv31 are used to calculate an approximation formula $$I = K + a*\exp(b*t) \tag{3}$$

using a known technique such as the least-square approach, so that this approximation formula provides a temporal change characteristic of the charge current. In this approximation formula, I denotes the charge current, K, a, b denote constants which can be decided through experiments, for example, and t denotes the elapsed time from the start of the constant-voltage charge. The constant K may be set to zero.

The process proceeds to step S8, where the processor 107 substitutes a predetermined final charge current value Icv (final) into the obtained approximation formula, and, at the present time, estimates an end time instant Tf at which the constant-voltage charge control will end. At step S8, the processor 107 further integrates the charge current Icv during the period of time ranging from the present time to the end time instant Tf of the control so that an integrated value $\alpha$ of the charge current Icv is obtained (i.e., $\alpha = \int Icv \cdot dt$).

The final charge current value Icv(final) is set to a value obtained at an SOC 90% of the battery 101 in a state where the constant-voltage charge control is performed in the foregoing conditions. This final charge current value Icv(final) is set previously through experiments or other means. Hence, at step S9, by subtracting the integrated value $\alpha$ of the charge current Icv ($\alpha = \int Icv \cdot dt$) from the SOC 90%, the present SOC is calculated with precision. In addition, at step S9, it is also estimated as to how much capacity should be charged to obtain the SOC 90% from now on. Then at step S1, the constant-voltage charge is ended.

In this way, in the present embodiment, it is possible to accurately estimate the charged state of the battery 101 in various situations. These situations include a timing immediately after the engine is started under a reduced capacity of the battery 101, in which a predetermined capacity of charge is needed. Such situations also includes a timing at which a large amount of electric load is added during, in particular, the vehicle run. In these situations, the battery 101 is charged more strongly by enhancing the generation of the generator 102 in order to compensate for a decrease in the battery SOC. More practically, if discharge polarization is caused because of continuing the constant-voltage charge in the above charge step, the discharge polarization disappears soon, so that a stable charge polarization state where a specific amount of polarization corresponding to the charge voltage is generated is provided at a time instant when the predetermined period of time passes after starting the constant-voltage charge in the present embodiment, the timing at which the stabilization is completed is detected by examining whether or not the change in the polarization-relevant quantity P becomes less than the preset threshold Pth.

In addition, only when the stable state with a specific amount of charge polarization is realized, the charge current is sampled at the given intervals to acquire necessary sampled current data. Those sampled current data are used to estimate the charge current characteristic. This characteristic is then use to estimate the integrated value of the charge current ($\alpha = \int Icv \cdot dt$) necessary during a period of time from the present time instant to a time instant at which a predetermined SOC value (for example 90%) is attained. It is therefore possible to accurately estimate the present SOC value and a total amount of charge necessary to gain the predetermined SOC value provided that the constant-voltage charge is started now. This estimation can be carried out without being affected by irregularities in the polarization state. This technique can also be used in detecting the overcharge.

Figure 3:
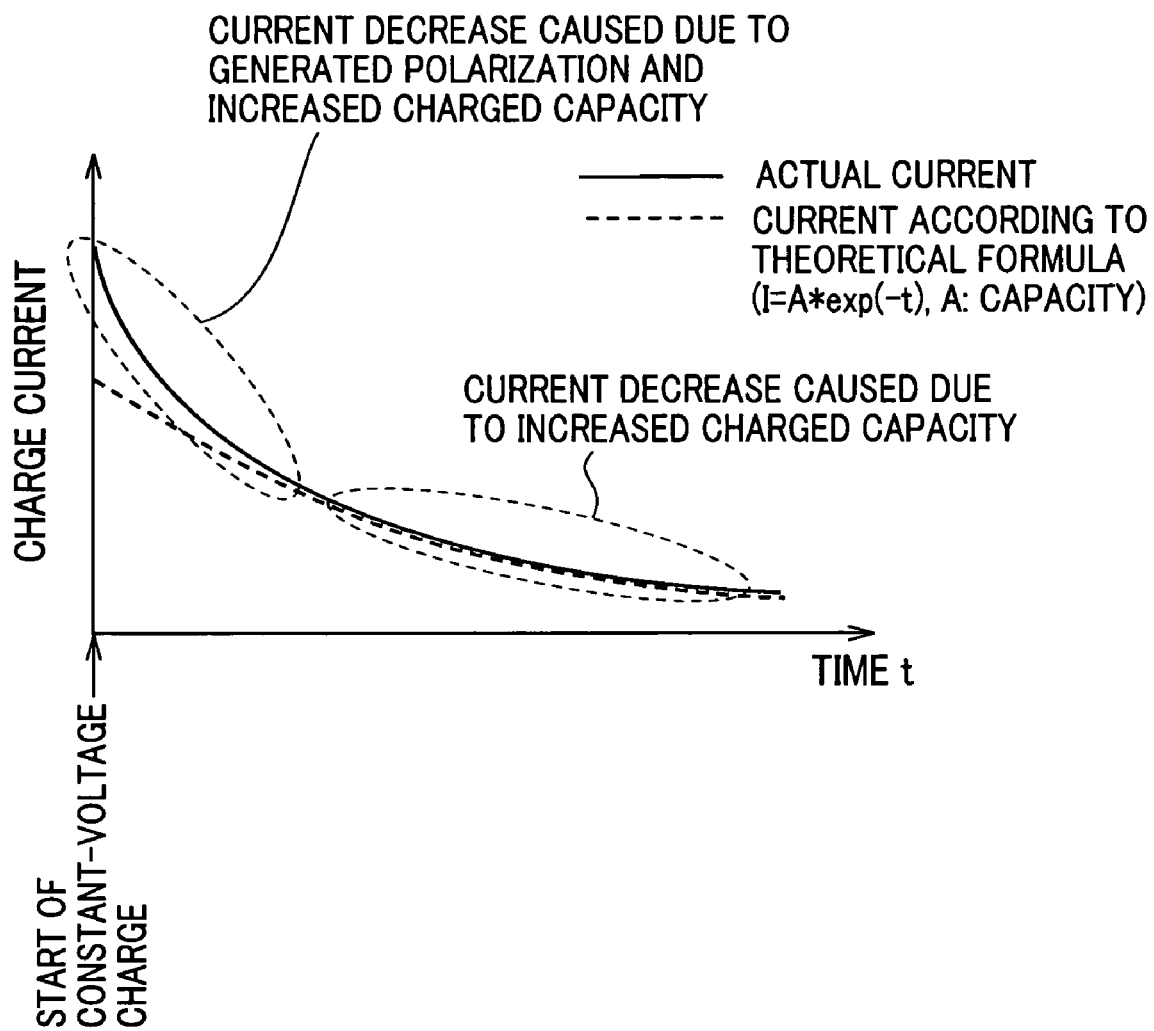
FIG. 3 is a graph typically showing a charge current characteristic of the battery, which can be provided during the constant-voltage charge control.

Referring to FIG. 3, advantages that are more practical will now be described.

FIG. 3 exemplifies a charge current characteristic obtained when a battery whose capacity is not fully charged is subjected to the constant-voltage charge. When starting the constant-voltage charge, there comes an initial charge range during which, due to an increase in the charged capacity and the generation of charge polarization, the graph showing the charge current characteristic shows a decrease in the change current. In particular, in the lead-acid battery, the influence of generation of the polarization is larger than the other types of batteries. A conventional approximation formula of charge current obtained under the constant-voltage charge state has not taken account of the influence of irregularities of the polarization at all.

In contrast, the present embodiment uses data of the charge current, which are sampled at intervals after the predetermined period of time from the start of the constant-voltage charge. Setting the predetermined period of time makes it possible to remove the influence of irregularities of the polarized state in a reliable manner. The sampled data acquired in this way are used to decide the charge current characteristic (i.e., the approximation formula), and estimate the internal electric state of the battery 101 using the charge current characteristic. In consequence, the influence of irregularities in the polarization state which appears in the initial range of the constant-voltage charge is eliminated, thus providing a higher-accuracy estimation of the charge current characteristic under the constant-voltage charge.

<Experimental Results>

Figure 4:
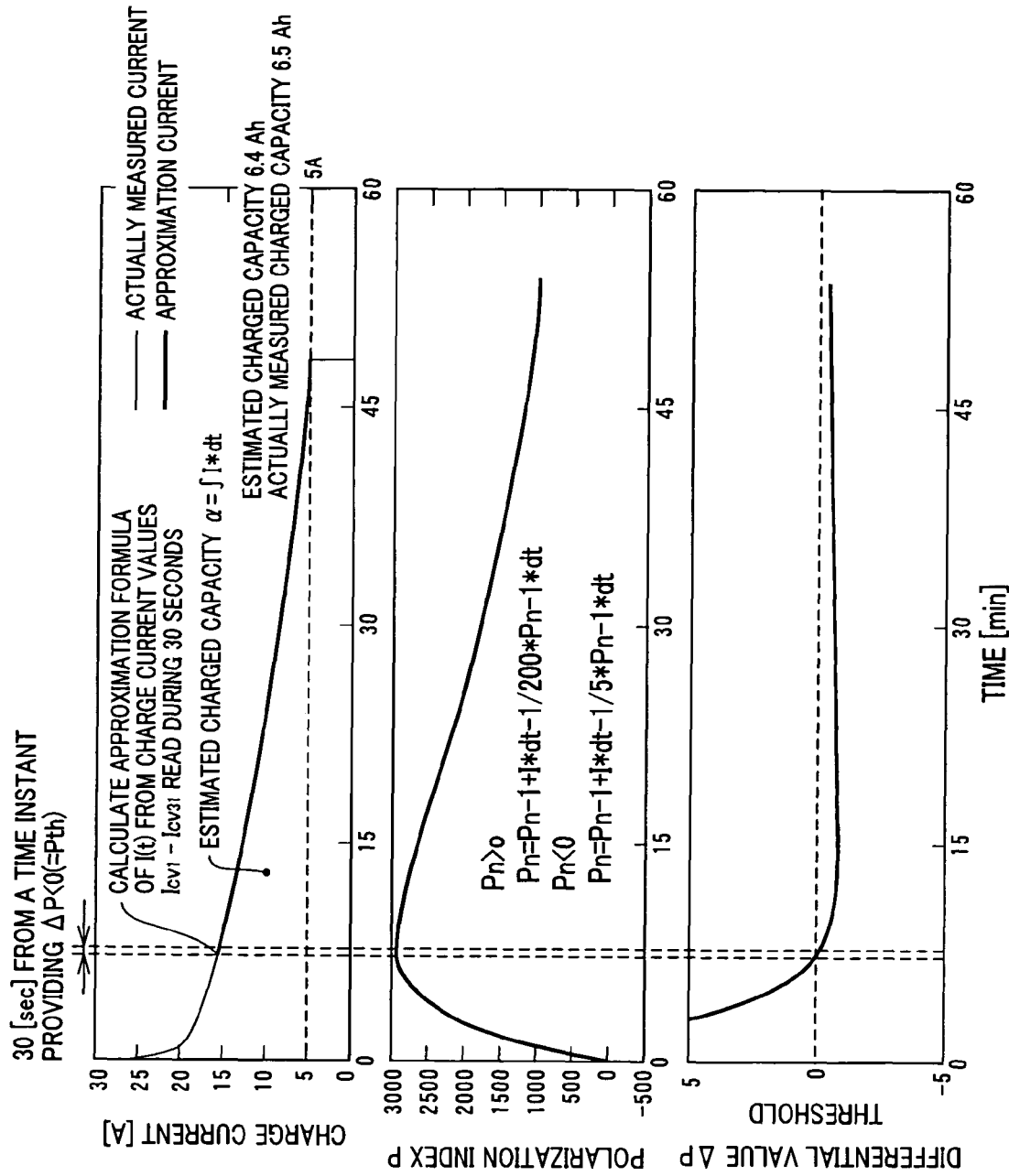
FIG. 4 shows graphs explaining a charge current characteristic, a polarization factor characteristic, and a differential value characteristic so of the polarization factor, which are obtained by the constant-voltage charge.

FIG. 4 shows an experimental result obtained when a charged amount was carried out under the constant-voltage charge. In the experimental case of FIG. 4, the constant-voltage charge was started first, and current values were stored for 30 seconds from a time instant at which a difference value of a polarization-relevant quantity (polarization index) obtained from charge current values becomes zero or less. Based on the stored current values, an approximation formula $I(t) = A * \exp(B * t)$ was obtained. A capacity integrated until a current value obtained based on this approximation formula reaches a given value of 5 A was calculated, which was 6.4 Ah. This value was almost the same as an actually measured charge capacity of 6.5 Ah, whereby it is understood that the charge capacity can be estimated with higher precision.

Figure 5:
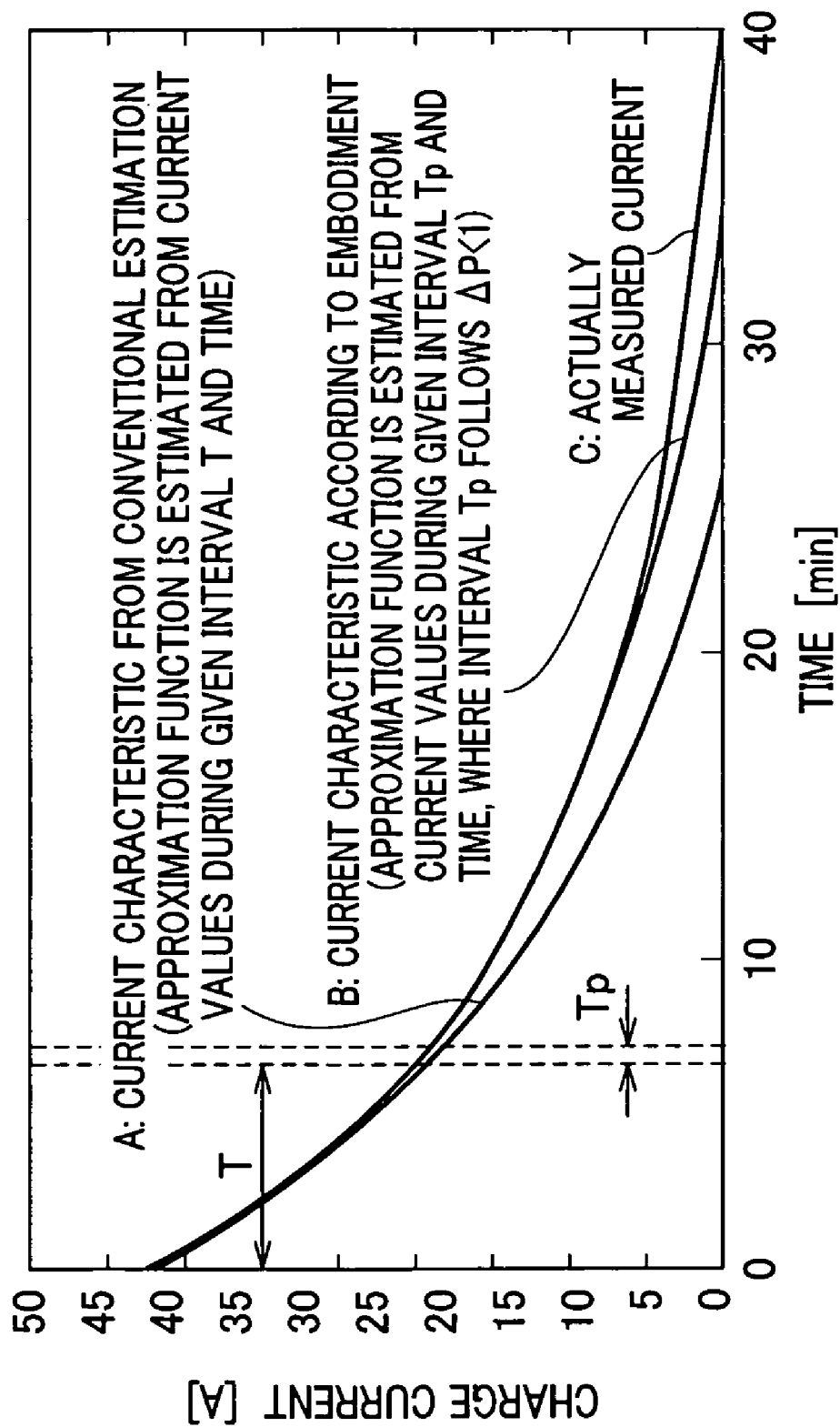
FIG. 5 shows graphs explaining, in a comparative manner, a conventional charge current characteristic (A), the charge current characteristic (B) according to the first embodiment, and an actually measured charge current characteristic (C)

In addition, FIG. 5 shows comparative results of experiments performed with the same in-vehicle lead-acid batteries, in which charge current characteristics A to C are shown. The charge current characteristic A shows an experiment performed based on the known technique with no consideration of the polarization, the charge current characteristic B shows another experiment performed according to the present embodiment, and the charge current characteristic C shows another experiment in which the discharge current was actually measured. In the case of the conventional technique (i.e., the characteristic A), the constant-voltage charge was continued for a given period of time T, during which the charge current was measured, and the charge current values and the time T were used to calculate an approximation formula. In this conventional case, the approximation is poorer in accuracy than the actually measured charge current (i.e., the characteristic C). By contrast, in the embodiment (i.e., the characteristic B), as stated, the approximation formula was obtained based on charge current values detected during a predetermined period of time Tp since a time instant providing $\Delta P < 0$ and the relative time. It is clear that the approximation according to the present embodiment is close to the actually measured charge current characteristic C, providing a higher approximation accuracy.

<Reduction in Polarization Amount Before Starting Constant-Voltage Charge>

In the present embodiment, the present value Pn of the polarization-relevant quantity P can be calculated based on the foregoing formula (1). This formula (1) needs the last value Pn−1 to be decided before calculating the present value Pn. This is true of the calculation of the formula (2). In the first calculation of the formula (1) based on current data detected at the first and second detection cycles, the last value Pn−1 has not been calculated yet. However, because the current charge/discharge current is approximately constant or very small, the last value Pn−1 can be treated as being constant or zero.

Hence, immediately after starting the engine, the integrated value of the charge/discharge current of an in-vehicle battery whose stored charge has been consumed by starting the engine can be regarded as being approximately constant. At the same time, the polarization in the battery can be regarded as having disappeared, due to non-operation of the battery for a long time. From this point of view, it can be assumed that discharge polarization of a constant amount is generated immediately after discharging the battery for starting the so engine. This polarization amount can be set to a given value. Additionally, immediately after starting the engine, the battery is always subjected to a given amount of discharge from its fully charged state. After this discharge, the battery is subjected to constant-voltage charge. This charge necessarily provides a given amount of integrated value of the charge current, which is an advantage of the constant-voltage charge performed immediately after starting the engine.

It is also possible to use the formula (1) to calculate the present value of the polarization in discharging for starting the engine. This discharge polarization amount calculated in this way can be assigned to the present value of the polarization-relevant quantity in starting the constant-voltage charge. Accordingly, as the last value Pn−1 of the polarization-relevant quantity which is needed at the second detection cycle of current data under the constant-voltage charge, the present value Pn of the foregoing polarization-relevant quantity P in the discharge action may be used.

When the vehicle is running, the SOC of an in-vehicle secondary battery takes various values. During vehicle running, an increase in the electric load or a decrease in the generated amount will necessitate the discharge of the battery for a certain period of time. In this case, the charge to the battery should be carried out to make up the decrease in the SOC. It is thus preferred to start the constant-voltage charge when a discharge action is continued for a given period of time.

When the discharge action is continued for a given period of time, a given amount of discharge polarization is generated in the battery. Thus, it is preferred that such a discharge action is followed by keeping the charge/discharge current at smaller values for a given period of time in order to remove the polarization caused by the discharge, and then by performing the constant-voltage charge.

In addition, there may be a period of time, during which the charge/discharge current is small so that the polarization can be regarded as having disappeared, is continued before the continuation of the discharge action for the given period of time. In such a case, the polarization at the time when the above continuation of the polarization starts is set to zero to calculate an amount of the polarization using the foregoing formula (1) (in which the signs are opposite), and the calculated amount is employed as the polarization-relevant quantity at the start of the constant-voltage charge. That is, this calculated amount can be used as the last value Pn−1 of the polarization-relevant quantity P calculated at the second detection cycle of the charged current under the constant-voltage charge.

Further, the foregoing constant-voltage charge may be performed using a regulation voltage Vref+ΔV higher the normal regulation voltage Vref at the generator. In this case, the polarization can be regarded as having disappeared if the charge/discharge current is below a given value during a given period of time before staring the constant-voltage charge under the vehicle run. Hence, the last value Pn−1 of polarization-relevant quantity P used at the second detection cycle of the charge current after starting the constant-voltage charge may be set to zero. In employing the regulation voltage Vref+ΔV, charge current, whose amount corresponds to the charge voltage difference ΔV, always flows during the constant-voltage charge, so that employing the regulation voltage Vref+ΔV is preferred.

There can be provided a modification of the foregoing embodiment which uses the approximate formula to estimate the charge current characteristic under the constant-voltage charge control. However, this is not the only example. For example, a table or an equation may be prepared beforehand, where the table or the equation defines the relationship among the absolute values of the charge current values Icv1 to Icv31, a decrease dIcv in the charge current during a given period of time (for example, 30 seconds), and accumulated capacities. From this table or the equation, the charge current characteristic may be derived.

Second Embodiment

Figure 6:
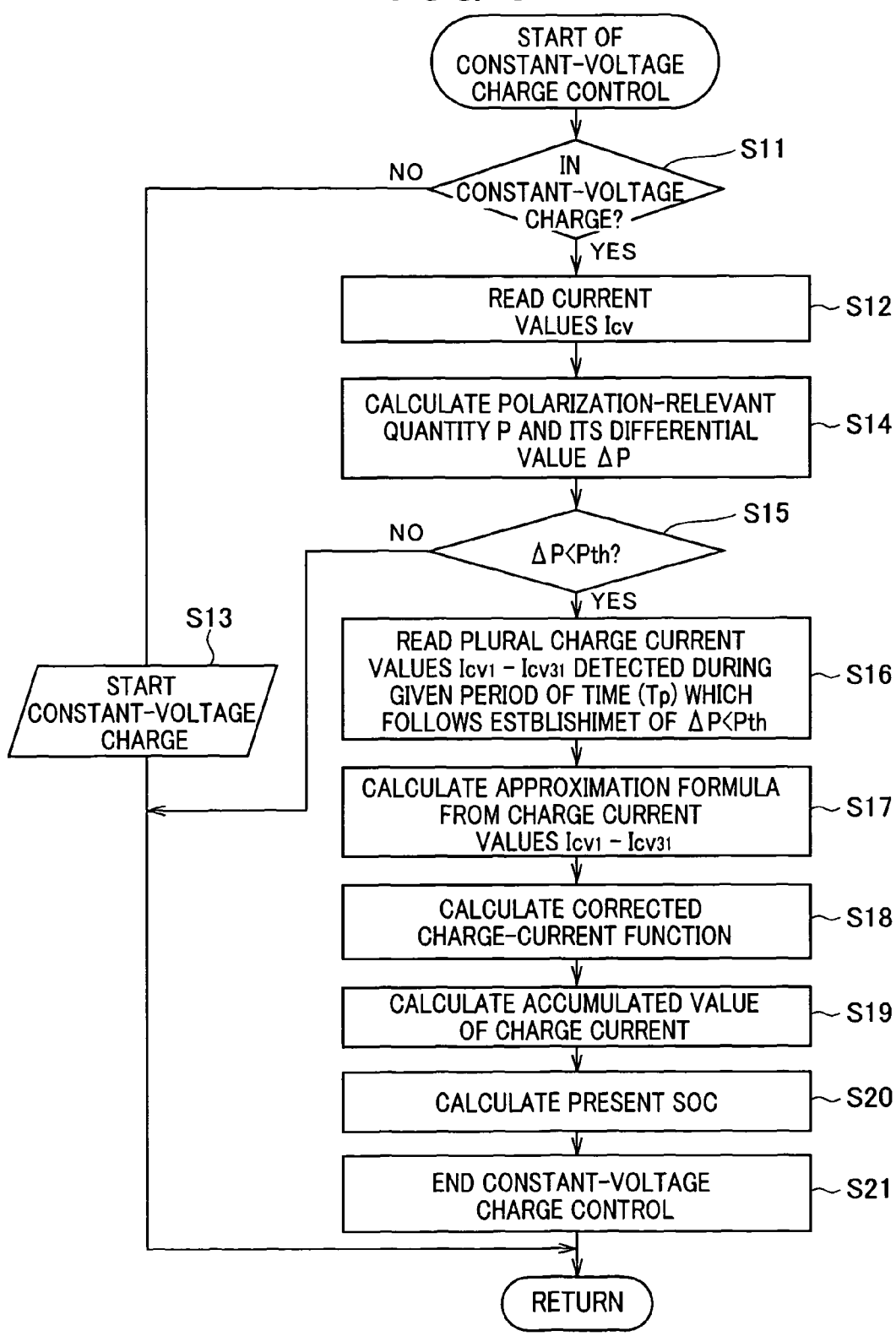
FIG. 6 is a flowchart outlining constant-voltage charge control executed by a processor incorporated in a SOC calculating apparatus serving as an apparatus for the internal electric state of an in-vehicle battery, which is according to a second embodiment of the present invention.
Figure 7:
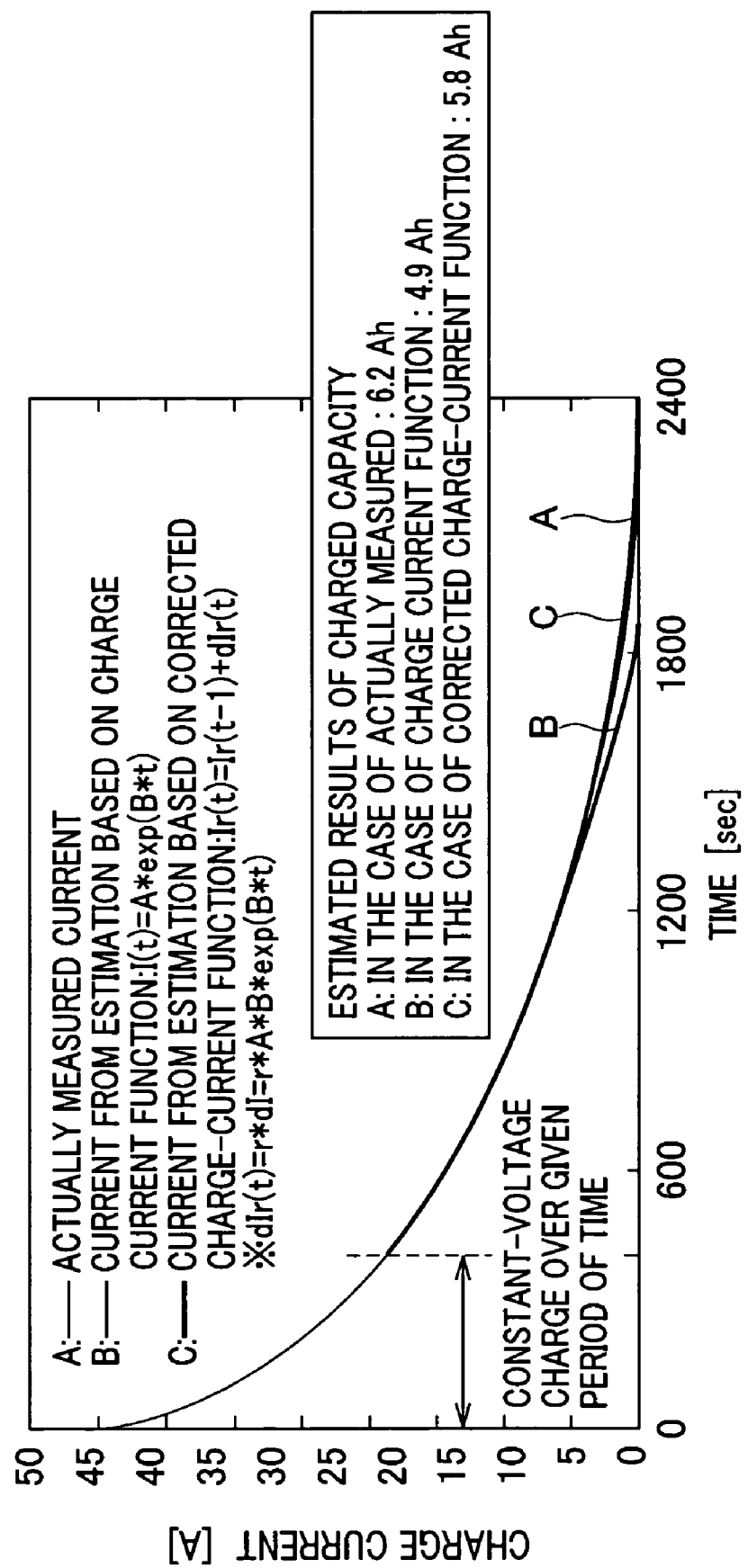
FIG. 7 is a graph showing an actually measured characteristic (A) of charge current flowing during the constant-voltage charge control, a charge current characteristic (B) corrected by a corrected charge current function, and a charge current characteristic (C) corrected by a charge current function.
Figure 8:
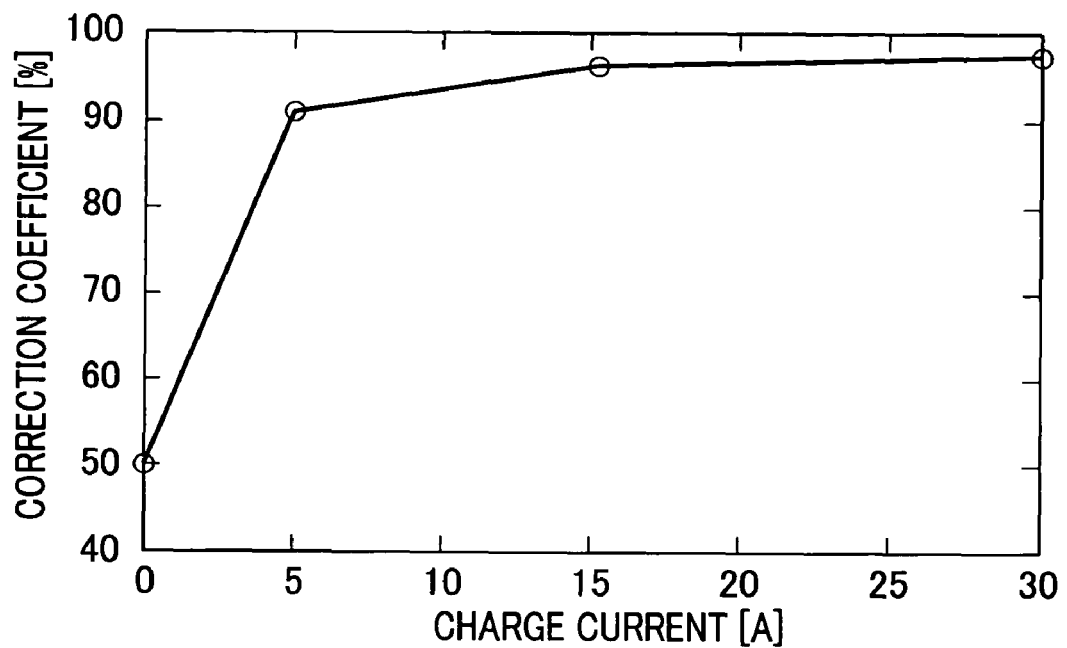
FIG. 8 is a graph exemplifying the relationship between the charge current values and correction coefficients.

Referring to FIGS. 6-8, a second embodiment of the detecting apparatus according the present invention will now be described.

In the second embodiment, like the first embodiment, the detecting apparatus is put into practice as the SOC calculating apparatus for an in-vehicle secondary battery. Incidentally the similar or identical components of this SOC calculating apparatus to those in the first embodiment will be given the same reference numerals for the sake of simplifying the description.

The hardware configuration of this SOC calculating apparatus is the same as the apparatus 1 described in FIG. 1 except that the processor 107 will operate based on a flowchart shown in FIG. 6. In addition, steps S11-S16 are the same in their contents as steps S1-S6. Among those steps, if it is determined YES at step S15, the processor 107 recognizes the polarization has disappeared sufficiently, and proceeds to step S16. At this step, like the forgoing first embodiment, the processor 107 reads charge current amounts Icv1 to Icv31 sampled and stored during a predetermined period of time T (e.g., 30 seconds) starting from at a time instant when the differential value ΔP decreased by less than the threshold Pth.

Then, the processor 107 proceeds to step S17, where the read-in charge current amounts Icv1 to Icv31 are used to calculate an approximation formula of I=K+a*exp(b*t) (which is the same as formula (3)), and employs this approximation formula as a temporal change characteristic of the charge current, that is, the charge current function according to the present invention. Incidentally this charge current function is not always limited to the foregoing approximation formula, but may be given by various known approximation techniques so that approximate current data detected during the constant-voltage charge period.

Then the process proceeds to step S18, where the processor 107 corrects the calculated approximation formula (i.e., the charge current function) with the use of correction coefficients previously stored in for example a memory in the processor 107. This correction produces a corrected function for the charge current (simply, a corrected charge-current function). This corrected charge-current function may be written in a map, instead of using a mathematical formula. The correction coefficients will detailed later.

Then, at step S19, the processor 107 substitutes a predetermined final charge current value Icv(final) into the corrected charge-current function to decide an end time instant Tf at which the constant-voltage charge control which is now in operation should end. Further, the charge current Icv is accumulated over a period of time from the present time instant to the end time instant Tf, under the assumption that the constant-voltage charge control is continued over such a period of time. Thus this charge-current accumulated value α is calculated as a sum by α=∫I·Idt, like the foregoing.

Hence, at step S20, by subtracting the integrated value α of the charge current Icv (α=∫cv·dt) from the SOC 90%, the present SOC is calculated with precision. In addition, at step S20, it is also estimated as to how much capacity should be charged to obtain the SOC 90% from now on. Then, at step S21, the constant-voltage charge is ended. To sample current data, the constant-voltage charge may be ended when step S16 is processed.

<How to Obtain Correction Coefficients>

The correction coefficients for correcting the charge current function (the approximation formula) will now be described. The correction coefficients are used to correct the slowness of a decrease in the charge current in the end of the constant-voltage charge, which slowness is attributable to some factors including a deteriorated charge characteristic of an in-vehicle secondary battery. The correction coefficients can be obtained using a number of techniques, some of which will be detailed later.

The first technique is as follows. When a charge current obtained from a charge current function based on current data at respective time instants under the constant-voltage charge is taken as a reference, an increase rate of the charge current to the reference has a positive correlation to an accumulated time of the charge/discharge of an in-vehicle secondary battery. This increase rate becomes larger as the charge/discharge cycle life becomes longer.

The corrected charge-current function Iγ is expressed by $$I\gamma = K' + a'^* \exp(b'^* t) \quad (4),$$

where K', a' and b' are coefficients, in which K' is a coefficient or function whose variable is the original coefficient K, a' is a coefficient or function of the original coefficient a, and b' is a coefficient or function of the is original coefficient b. The original coefficients K, a and b are shown in the formula (3). With the view to simplifying the calculation, it is preferred that each of the functions is a first order function. Of course, a map may be used to decide the coefficients.

When employing the function or map, not constant values, the function or map may be produced as follows.

For example, the first order functions or maps of these coefficients K', a' and b' may be produced respectively in advance, wherein their variables are set to the accumulated time T of the charge/discharge current of the battery. The produced functions or maps are stored in for example in a memory incorporated in the processor 107. In this case, the time T is substituted or applied into or to the functions or maps, whereby the coefficients K', a' and b' can be determined uniquely.

The accumulated time T of the charge/discharge current can be so estimated using various techniques. For example, using a counter that counts an accumulated value of the time in which the charge/discharge current is over a preset value, during a period of time in which the ignition switch is turned on. This count can be regarded as being approximately equal to the charge/discharge current accumulation time.

Only one or two of the coefficients K', a' and b' may be corrected. For example, the correction coefficients γ may be set by being a'=γ·a, as to coefficient a, for example.

The correction coefficients can be written in the memory when being shipped from a manufacturer's factory. Alternatively, using previously stored mathematical formulae, the correction coefficients can be calculated from state signals detected from an in-vehicle battery during the operation thereof. In this case, the state signals are signal showing voltage, current, temperature, and/or operation time of the battery. An alternative technique is to occasionally perform a long-term constant-voltage charge control which continues to a charge end (for example, to the timing at which an SOC of 90% is gained) of the battery, and to use charge current values obtained during the control in order to drive mathematical formulae or maps which give the coefficients.

The second technique is as follows. When a charge current obtained from a charge current function under the constant-voltage charge is taken as a reference, both a maximum amount and an increase rate of the charge current to the reference have a positive correlation to an increase in the elapse time of the constant-voltage charge. Both the maximum amount and the increase rate become larger as the constant-voltage charge elapse time becomes longer.

The corrected charge-current function Iγ is expressed by the formula (4), in the same way as that explained in the first technique. When employing the function or map, not constant values, the function or map may be produced as follows. For example, like the foregoing first technique, the first order functions or maps of these coefficients K', a' and b' may be produced respectively in advance and can be used in the same way as that for the first technique.

<Experimental Results>

FIG. 7 shows excremental results of measuring and estimating the charge capacity under the constant-voltage charge of a conventionally used lead-acid battery to be mounted in a vehicle.

As shown in FIG. 4, the experiments were associated with the constant-voltage charge performed for 480 seconds, during which time a large number of charge current values are sampled at intervals from the start of the constant-voltage charge. Respective pairs of the charge current values and the elapsed time t from the start of the constant-voltage charge were subjected to calculation of a charge current function of $I(t)=A^*\exp(B^*t)$. Then, a corrected charge-current function $I\gamma(t)=\gamma^*A^*\exp(B^*t)$ was obtained by applying correction coefficients γ to the charge current function of $I(t)=A^*\exp(B^*t)$. Hence, the differential coefficients d Iγ (t) of the corrected charge-current function Iγ (t) is expressed by the following formula:

$$dI\gamma(t) = \gamma * A * B * \exp(B * t)) \quad (5)$$
$$= I\gamma(t) - I\gamma(t-1),$$

where Iγ (t) denotes the present value of the corrected charge-current function, Iγ(t−1) denotes the last value of the corrected charge-current function, and dt denotes the calculation cycle (repetition time) for the corrected charge-current function.

This corrected charge-current function was used to estimate a value of the charge current accumulated during a period of time to a time instant at which the charge current reaches a final charge current Icv(final). This current Icv (final) was preset to be equal to a current value gained when an SOC of 90% is realized in the charge action. The estimation revealed that the accumulated value of the charge current (i.e., the charged capacity) was 5.8 Ah. In contrast, in an actual experiment where the constant-voltage charge was continued, the measured accumulated value of the charge current was 6.2 Ah. This showed that the estimation was very accurate because of only a difference of 0.4 Ah in both cases.

The accumulated value of the charge current was also estimated using the foregoing charge current function, but with no correction thereto. This estimation showed an accumulated value of 4.9 Ah, whereby there was no less than 1.3 Ah from the actually measured charged capacity of 6.2 Ah.

FIG. 5 shows the relationship between the correction coefficients γ and the charge current actually measured during the constant-voltage charge. The correction coefficients γ in FIG. 5 were decided in such a manner that the constant-voltage charge was performed in advance using batteries to be mounted in the vehicle, and an actually measured charge current value and a value calculated using the corrected charge-current function, which are obtained at each of the measuring time points during the same elapsed time frame, are subjected to a process that gives a minimum square error.

In the in-vehicle battery, how to use it or how long the battery is used will affect the battery characteristics (such as battery charge efficient and battery internal resistance) so that the charge current decreasing characteristic during the constant-voltage charge (refer to FIG. 7) will change. In considering this fact, it is preferred that the foregoing correction coefficients γ are corrected depending on the present internal electric states of a battery, which states depend on for example its operation time period. This correction example is shown in FIG. 9.

Figure 9:
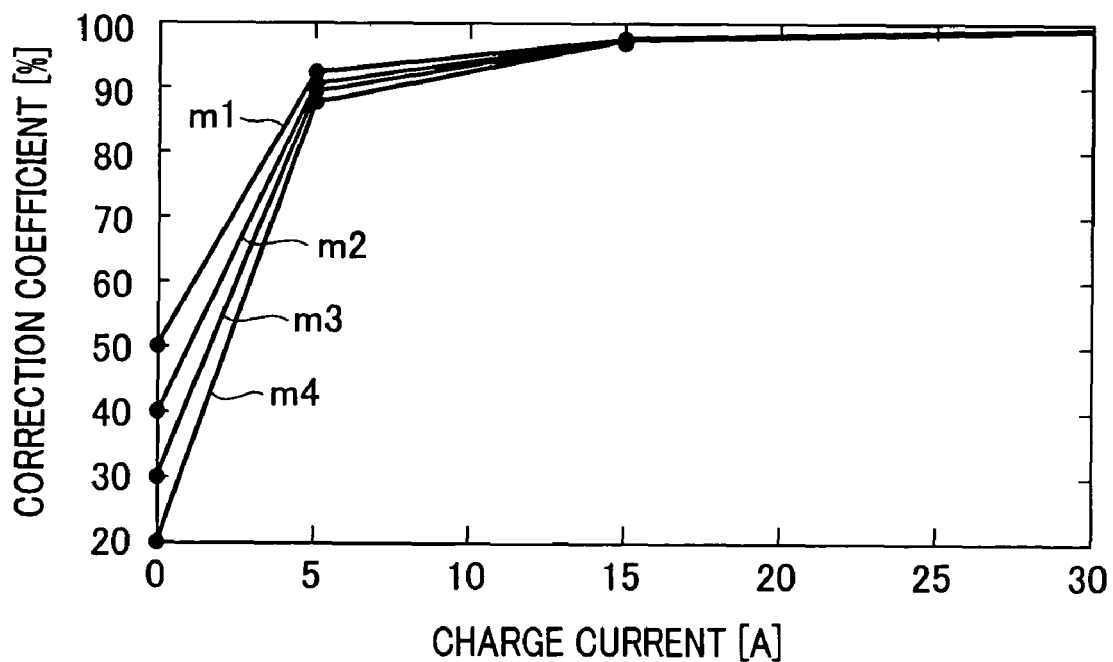
FIG. 9 provides graphs exemplifying four maps (m1 to m4) that provide different relationships between the charge current values and the correction coefficients.

As shown in FIG. 9, maps m1 to m4 that define relationships between a plurality of charge current amounts v.s., the correction coefficients γ are prepared in advance. Immediately after the constant-voltage charge, actually measured charge current values and a plurality of sets of calculated charge current values are used to select a suitable map m1 (to m4), so that suitable correction coefficients γ based on the selected map m1 (to m4) are provided. The selection is made such that the square error between the actually measured charge current values and each set of the calculated charge current values becomes a minimum. To obtain the calculated charge current values, a charge current function is calculated from the actually measured charge current values, and the function is corrected into each of corrected charge-current functions by correcting the charge current function with each of the correction coefficient maps m1 to m4 shown in FIG. 6. Using each corrected charge-current function, the plurality of sets of calculated charge current values are calculated at the same timings as the actually measured charge current values.

In the present embodiment, it is possible to accurately estimate the charged state of the battery 101 in various situations. These situations include a timing immediately after the engine is started under a reduced capacity of the battery 101, in which a predetermined capacity of charge is needed. Such situations also include a timing at which a large amount of electric load is put on during, in particular, the vehicle run. In these situations, the battery 101 is charged more strongly by enhancing the generation of the generator 102 in order to compensate for a decrease in the battery SOC.

The present embodiment may be developed into a modification where sampling of the charge current is started after a predetermined period of time ΔT since the start of the constant-voltage charge or started at a time instant at which the charge current is reduced by a given-rate amount from a charge current value obtained at the start of the constant-voltage charge. This adjustment of the sampling timing can remove or alleviate the influence of the polarization (charge so polarization) to be caused in the constant-voltage charge.

The present invention may be embodied in several other forms without departing from the spirit thereof. The embodiments and modifications described so far are therefore intended to be only illustrative and not restrictive, since the scope of the invention is defined by the appended claims rather than by the description preceding them. All changes that fall within the metes and bounds of the claims, or equivalents of such metes and bounds, are therefore intended to be embraced by the claims.

What is claimed is:

1. An apparatus that estimates an internal electric state of an in-vehicle secondary battery of which terminal voltage is regulated at a target value by operating an in-vehicle alternator, the apparatus comprising:
   a current detector that detects charge current flowing to the battery and discharge current from the battery;
   sampling means that samples and holds, at intervals, the current detected by the current detector;
   charge means that performs constant-voltage charging of the battery at a preset value given to the battery immediately after start of the vehicle or during running of the vehicle;
   first calculation means that calculates a polarization-relevant quantity relevant to an amount of polarization caused in the battery immediately after start of the constant-voltage charge using data of the charge current from the sampling and holding means;
   determination means that determines whether or not a change rate of the calculated polarization-relevant quantity is less than a given threshold;
   acquisition means that acquires from the sampling and holding means a plurality of data of the charge current sampled and held during a predetermined period of time when it is determined that the change rate of the calculated polarization-relevant quantity is less than the given threshold;
   second calculation means that calculates a value of the charge current to be accumulated until the charge current reaches a given final value, using the plurality of data of the charge current; and
   estimation means that estimates the internal electric state of the battery based on the calculated accumulated value of the charge current.

2. The apparatus of claim 1, wherein
   the charge means is configured to perform the constant-voltage charge after start of an engine of the vehicle, and
   the first calculation means, the determination means, the acquisition means, the second calculation means, and the estimation means are configured to work together so as to estimate the internal electric state of the battery during the constant-voltage charge immediately after the start of the engine.

3. The apparatus of claim 1, wherein
   the charge means is configured to perform the constant-voltage charge at a timing during the running of the vehicle, the charge current of more than a given value flowing at the timing, and
   the first calculation means, the determination means, the acquisition means, the second calculation means, and the estimation means are configured to work together so as to estimate the internal electric state of the battery at the timing during the running of the vehicle.

4. The apparatus of claim 1, wherein
   the charge means is configured to perform the constant-voltage charge at a timing during the running of the vehicle, wherein the timing follows a situation where the charge and discharge current of less than a given value continues for a predetermine period of time, and
   the first calculation means, the determination means, the acquisition means, the second calculation means, and the estimation means are configured to work together so as to estimate the internal electric state of the battery at the timing during the running of the vehicle.

5. The apparatus of claim 1, wherein
   the first calculation means is configured to calculate the polarization-relevant quantity P based on a formula of:

$$Pn=Pn-1+In*dt-1/T*Pn-1*dt,$$

wherein Pn denotes a present value of the polarization-relevant quantity P, Pn−1 denotes a last value of the polarization-relevant quantity P, In denotes a present value of the charge current, dt denotes intervals of sampling and holding the charge current during the constant-voltage charge, and T denotes a time constant.

6. The apparatus of claim 1, wherein
   the second calculation means is configured to calculate, using the plurality of data of the charge current acquired by the acquisition means, an approximation formula of the charge current I based on:

$$I=K+a*\exp(b*t),$$

wherein a and b are constants, t denotes an elapsed time from the start of the constant-voltage charge, and K is a given proportional constant.

7. A method that estimates an internal electric state of an in-vehicle secondary battery of which terminal voltage is regulated at a target value by operating an in-vehicle alternator, the method comprising steps of:

sampling and holding, at intervals, charge current flowing to the battery and discharge current from the battery;

performing constant-voltage charge with the battery at a preset value given to the battery immediately after start of the vehicle or during running of the vehicle;

first calculating a polarization-relevant quantity relevant to an amount of polarization caused in the battery immediately after start of the constant-voltage charge using data of the charge current from the sampling and holding step;

determining whether or not a change rate of the calculated polarization-relevant quantity is less than a given threshold;

acquiring from the sampling and holding step a plurality of data of the charge current sampled and held during a predetermined period of time when it is determined that the change rate of the calculated polarization-relevant quantity is less than the given threshold;

second calculating a value of the charge current to be accumulated until the charge current reaches a given final value, using the plurality of data of the charge current; and estimating the internal electric state of the battery based on the calculated accumulated value of the charge current.

8. An apparatus that estimates an internal electric state of an in-vehicle secondary battery of which terminal voltage is regulated at a target value by operating an in-vehicle alternator, the apparatus comprising:

a current detector that detects charge current flowing to the battery and discharge current from the battery;

sampling means that samples and holds, at intervals, the current detected by the current detector;

charge means that performs constant-voltage charging of the battery at a preset value given to the battery immediately after start of the vehicle or during running of the vehicle;

calculation means that calculates a charge current function indicating a temporal change in the charge current based on a plurality of data of the charge current sampled and held after start of the constant-voltage charge;

storing means that stores previously a correcting value or a correcting function which has a correlation to deterioration of the battery;

correction means that corrects the charge current function by the correcting value or the correcting function;

accumulation means that accumulates the charge current until the charge current reaches a given final value, based on the corrected charge current function; and estimation means that estimates the internal electric state of the battery using the accumulated value of the charge current.

* * * * *